United States Patent
Sakurai et al.

(10) Patent No.: US 11,664,615 B2
(45) Date of Patent: May 30, 2023

(54) CIRCUIT BOARD HAVING TERMINAL, AND CIRCUIT BOARD ASSEMBLY

(71) Applicant: Tyco Electronics Japan G.K., Kawasaki (JP)

(72) Inventors: Yohei Sakurai, Kawasaki (JP); Daisuke Dobashi, Kawasaki (JP)

(73) Assignee: Tyco Electronics Japan G.K., Kawasaki (JP)

( * ) Notice: Subject to any disclaimer, the term of this patent is extended or adjusted under 35 U.S.C. 154(b) by 0 days.

(21) Appl. No.: 17/167,477

(22) Filed: Feb. 4, 2021

(65) Prior Publication Data

US 2021/0159623 A1    May 27, 2021

Related U.S. Application Data

(63) Continuation of application No. PCT/JP2019/026993, filed on Jul. 8, 2019.

(30) Foreign Application Priority Data

Aug. 7, 2018 (JP) .............................. JP2018-148540

(51) Int. Cl.
*H01R 12/72* (2011.01)
*H01R 12/71* (2011.01)

(52) U.S. Cl.
CPC ......... *H01R 12/724* (2013.01); *H01R 12/716* (2013.01)

(58) Field of Classification Search
CPC .......... H05K 3/366; H05K 1/11; H05K 1/141; H05K 1/142; H05K 1/14; H01R 12/718; H01R 12/716; H01R 12/724; H01R 12/728; H01R 12/735; H01R 12/737

USPC .............................................. 439/65, 55, 53
See application file for complete search history.

(56) References Cited

U.S. PATENT DOCUMENTS

| | | | |
|---|---|---|---|
| 6,404,394 B1 | 6/2002 | Hill | |
| 6,461,169 B1 * | 10/2002 | Harrison | H05K 3/366 |
| | | | 439/55 |
| 6,808,399 B2 * | 10/2004 | Rothermel | H01R 13/6585 |
| | | | 439/108 |

(Continued)

FOREIGN PATENT DOCUMENTS

| | | |
|---|---|---|
| DE | 2013258 A1 | 10/1971 |
| DE | 202006020076 U1 | 10/2007 |

(Continued)

OTHER PUBLICATIONS

International Search Report and Written Opinion, dated Sep. 10, 2019, 4 pages.

(Continued)

*Primary Examiner* — Marcus E Harcum
(74) *Attorney, Agent, or Firm* — Barley Snyder

(57) ABSTRACT

A circuit board includes a terminal area projecting from an end face of the circuit board. The terminal area is flush with a front side and a back side of the circuit board and has a thickness equal to the circuit board. The terminal area has a plurality of sides covered with an electrically conductive material, the sides including a first surface flush with a front side of the circuit board, a second surface flush with a back side of the circuit board, and a pair of side surfaces that intersect the first surface and the second surface.

13 Claims, 4 Drawing Sheets

(56) References Cited

U.S. PATENT DOCUMENTS

| | | | | |
|---|---|---|---|---|
| 6,824,391 | B2* | 11/2004 | Mickievicz | H01R 13/6477 |
| | | | | 439/61 |
| 6,882,538 | B1* | 4/2005 | Frisch | H01L 25/162 |
| | | | | 174/252 |
| 6,932,649 | B1* | 8/2005 | Rothermel | H01R 13/6658 |
| | | | | 439/620.01 |
| 7,109,948 | B2* | 9/2006 | Oyama | H01Q 1/241 |
| | | | | 343/700 MS |
| 7,379,021 | B2* | 5/2008 | Lee | H01Q 1/243 |
| | | | | 343/700 MS |
| 7,641,495 | B1* | 1/2010 | Sun | H01R 12/721 |
| | | | | 439/327 |
| 7,804,695 | B2 | 9/2010 | Thevenard et al. | |
| 7,864,544 | B2* | 1/2011 | Smith | H05K 3/366 |
| | | | | 361/774 |
| 9,780,471 | B2* | 10/2017 | Van Rijswijk | H05K 1/11 |
| 9,799,973 | B2* | 10/2017 | Sizemore | H05K 1/117 |
| 10,147,996 | B2* | 12/2018 | Bose | H01Q 1/1214 |
| 10,971,880 | B2* | 4/2021 | Parker | H05K 3/366 |
| 10,998,678 | B1* | 5/2021 | Miller | H01R 13/6473 |
| 2005/0135067 | A1* | 6/2005 | Park | H01L 25/105 |
| | | | | 361/715 |
| 2007/0170452 | A1* | 7/2007 | Kurokawa | H05K 1/021 |
| | | | | 257/99 |
| 2007/0173080 | A1* | 7/2007 | Johnson | H01R 12/721 |
| | | | | 439/66 |
| 2009/0151156 | A1 | 6/2009 | Yan et al. | |
| 2010/0166211 | A1* | 7/2010 | Snider | H05K 1/0215 |
| | | | | 381/86 |
| 2011/0122045 | A1* | 5/2011 | Seo | H01Q 9/40 |
| | | | | 343/906 |
| 2011/0149543 | A1* | 6/2011 | Kamoi | H05K 3/366 |
| | | | | 361/803 |
| 2012/0302074 | A1* | 11/2012 | Hartenstein | H01R 12/737 |
| | | | | 439/78 |
| 2014/0118219 | A1* | 5/2014 | Baan Hofman | H01R 12/592 |
| | | | | 343/906 |
| 2015/0011128 | A1* | 1/2015 | Stock | H05K 1/141 |
| | | | | 439/629 |
| 2015/0311605 | A1* | 10/2015 | Moore | H01R 12/53 |
| | | | | 439/84 |
| 2016/0146442 | A1* | 5/2016 | Fong | H01R 12/737 |
| | | | | 362/363 |
| 2016/0268034 | A1* | 9/2016 | Subat | H05K 3/366 |
| 2017/0167914 | A1* | 6/2017 | Shen | H05K 1/181 |
| 2020/0236786 | A1* | 7/2020 | Sasaki | H05K 1/141 |
| 2020/0260583 | A1* | 8/2020 | Nakase | H05K 3/366 |
| 2021/0267060 | A1* | 8/2021 | Fujima | H05K 3/366 |

FOREIGN PATENT DOCUMENTS

| | | | | |
|---|---|---|---|---|
| DE | 202006020076 | U1* | 10/2007 | H05K 3/366 |
| DE | 202015008007 | U1* | 1/2016 | H05K 3/366 |
| DE | 202016101086 | U1* | 6/2017 | H05K 3/366 |
| DE | 102020104100 | B3* | 8/2021 | H05K 3/366 |
| EP | 1079463 | A2 | 2/2001 | |
| EP | 1729555 | A1* | 12/2006 | H05K 3/366 |
| EP | 1804561 | A1* | 7/2007 | H05K 3/366 |
| EP | EP-1953871 | A2* | 8/2008 | H01R 12/52 |
| EP | 3489082 | A1* | 5/2019 | F21S 45/10 |
| JP | 51-124478 | U | 10/1976 | |
| JP | 5493455 | A | 7/1979 | |
| JP | 29589 | Y2 | 3/1990 | |
| JP | H02132970 | A | 5/1990 | |
| JP | 534146 | Y2 | 8/1993 | |
| JP | 2001284761 | A | 10/2001 | |
| JP | 2005197493 | A | 7/2005 | |
| JP | 2005236089 | A | 9/2005 | |
| JP | 200768106 | A | 3/2007 | |
| JP | 200827869 | A | 2/2008 | |
| JP | 2009-207142 | A | 9/2009 | |
| JP | 2011-222826 | A | 11/2011 | |
| JP | 2013219109 | A | 10/2013 | |
| JP | D1494057 | | 4/2014 | |
| JP | 201582538 | A | 4/2015 | |
| JP | 2015141796 | A* | 8/2015 | H01R 12/7005 |
| JP | 201717089 | A | 1/2017 | |
| JP | 201798339 | A | 6/2017 | |
| JP | 2018107589 | A | 7/2018 | |
| TW | 200937740 | A* | 9/2009 | |
| WO | WO-2011140689 | A1* | 11/2011 | H05K 3/0014 |
| WO | WO-2012171565 | A1* | 12/2012 | H05K 1/119 |
| WO | WO-2020200464 | A1* | 10/2020 | H01P 5/028 |

OTHER PUBLICATIONS

-xtended European Search Report, Application No. 19847204.5-1202/3836763 PCT/JP2019026993, dated Mar. 25, 2022, 7 pages.

Japanese Office Action dated Jul. 15, 2022 with English translation thereof, corresponding to Application No. 2018-148540, 10 pp.

* cited by examiner

CIRCUIT BOARD HAVING TERMINAL, AND CIRCUIT BOARD ASSEMBLY

CROSS-REFERENCE TO RELATED APPLICATIONS

This application is a continuation of PCT International Application No. PCT/JP2019/026993, filed on Jul. 8, 2019, which claims priority under 35 U.S.C. § 119 to Japanese Patent Application No. 2018-148540, filed on Aug. 7, 2018.

FIELD OF THE INVENTION

The present invention relates to a circuit board and, more particularly, to a circuit board having a terminal.

BACKGROUND

In mounting a circuit component on a circuit board, a mounting method has been widely adopted in which a pin-shaped terminal of the circuit board is inserted into a through hole whose inner wall surface is plated with an electrically conductive material and the terminal is soldered within the through hole.

In mounting a circuit board on another circuit board, it is conceivable that the aforementioned mounting method may be applied. That is, it is conceivable that a pin-shaped terminal may be fixed to one of the circuit boards by soldering or the like, that a through hole may be formed in the other of the circuit boards, and that the terminal may be inserted into and soldered to the through hole. However, this coupling structure poses a risk for incurring high costs, as it requires a terminal separately from a circuit board.

Japanese Patent Application No. 2017-17089A discloses a coupling structure in which an end of a first circuit board is inserted into a through hole of a second circuit board. In the case of the coupling structure of JP2017-17089A, since only two surfaces, namely front and back surfaces of the first circuit board, are solderable, there is a risk of insufficient soldering.

To address this problem, the aforementioned mounting method, in which a terminal is inserted into and soldered to a through hole, may be applied to the coupling structure disclosed in JP2017-17089A. That is, an inner wall surface of the through hole of the second circuit board is plated with an electrically conductive material, the end of the first circuit board is treated as a terminal to be inserted into the through hole, and the end is soldered within the through hole. Adopting this method, which does not require a terminal separately from a circuit board, achieves a reduction in cost.

A standard of a type of terminal that is inserted into a through hole requires that soldering be done over 75% or more of an inner wall surface of the through hole. For this reason, an attempt to satisfy this standard with electrically conductive materials on two surfaces, namely front and back surfaces, of a circuit board makes it necessary that the area of the right and left end faces of the terminal be less than 25% of the area of the whole circumference of the terminal or that the area proportion be further reduced for the sake of safety. This means that the terminal needs to be long drawn along the front and back sides of the circuit board. In this case, a plurality of terminals cannot be arrayed at fine pitches and application to such a use is impossible. Further, in the case of a circuit that requires impedance matching with the inclusion of a terminal, e.g. a case where an antenna pattern or the like is formed or mounted on a circuit board, there is a risk that impedance matching may become unable to be done with a long-drawn terminal.

SUMMARY

A circuit board includes a terminal area projecting from an end face of the circuit board. The terminal area is flush with a front side and a back side of the circuit board and has a thickness equal to the circuit board. The terminal area has a plurality of sides covered with an electrically conductive material, the sides including a first surface flush with a front side of the circuit board, a second surface flush with a back side of the circuit board, and a pair of side surfaces that intersect the first surface and the second surface.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
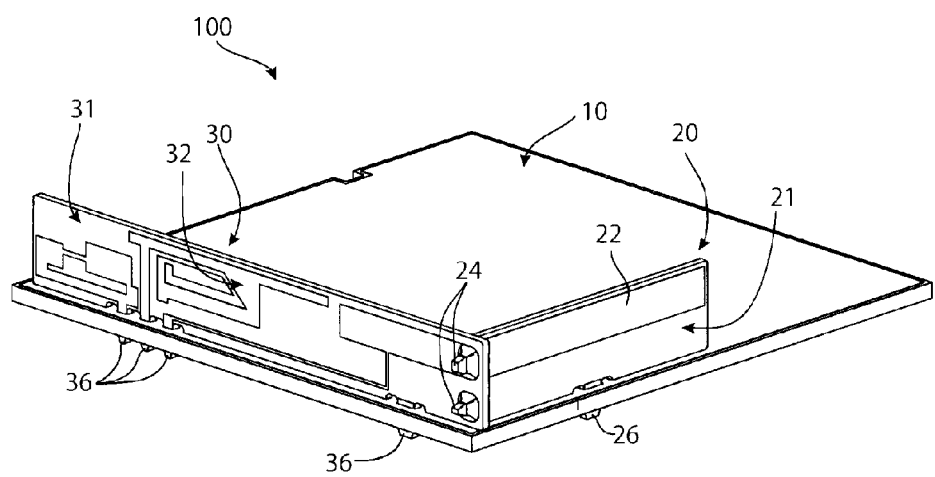
FIG. 1 is a perspective view of a circuit board assembly according to an embodiment.

The technical solution of the disclosure will be described hereinafter in further detail with reference to the following embodiments, taken in conjunction with the accompanying drawings. In the description, the same or similar reference numerals indicate the same or similar parts. The description of the embodiments of the disclosure hereinafter with reference to the accompanying drawings is intended to explain the general inventive concept of the disclosure and should not be construed as a limitation on the disclosure.

In addition, in the following detailed description, for the sake of explanation, numerous specific details are set forth in order to provide a thorough understanding of the disclosed embodiments. It will be apparent, however, that one or more embodiments may also be practiced without these specific details. In other instances, well-known structures and devices are illustrated schematically in order to simplify the drawing.

A circuit board assembly 100 according to an embodiment, as shown in FIG. 1, includes three circuit boards, namely a main board (parent board) 10, a first child board 20, and a second child board 30. The first child board 20 has a front surface 21 on which a circuit pattern 22 is formed, and the circuit pattern 22 constitutes a part of an antenna pattern 32 formed mainly on a front surface 31 of the second child board 30. This circuit pattern 22 is connected via one of two terminal areas 24 to the antenna pattern 32 formed on the second child board 30.

Figure 2:
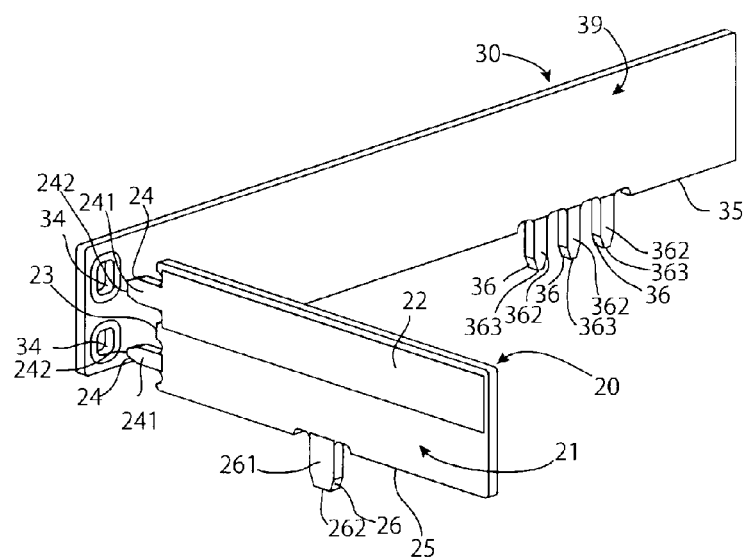
FIG. 2 is an exploded perspective view of a first child board and a second child board of the circuit board assembly.

As shown in FIG. 2, two terminal areas 24 are provided on a side of the first child board 20 that faces the second child board 30. Each of these terminal areas 24 has a shape that projects from a side end face of the first child board 20, that is flush with the front and back sides of the first child board 20, and that is as thick as the first child board 20.

Each of these terminal areas 24, as shown in FIG. 2, has a first surface 241 that is flush with the front surface 21 of the first child board 20 and on which an electrically conductive material film is formed and a second surface that is flush with the back surface of the first child board 20 and on which an electrically conductive material film is formed. Further, both side surfaces of each of the terminal areas 24 that intersect the first surface 241 and the second surface are covered with electrically conductive material films, too. These films on both side surfaces, in an embodiment, are formed by an electroless plating process which is the same as non-electrolytic plating on an inner wall surface of a through hole. Furthermore, a tip end face 242 of each of the terminal areas 24 that projects from the first child board 20 may be covered with an electrically conductive material film. This tip end face 242 is equivalent to an example of the fifth surface of the present invention.

The second child board 30, as shown in FIG. 2, has two vertically long through holes 34 into which the two terminal areas 24 of the first child board 20 are inserted, respectively. These through holes 34 have their inner wall surfaces covered with electrically conductive material films on all sides thereof by non-electrolytic plating.

Figure 3:
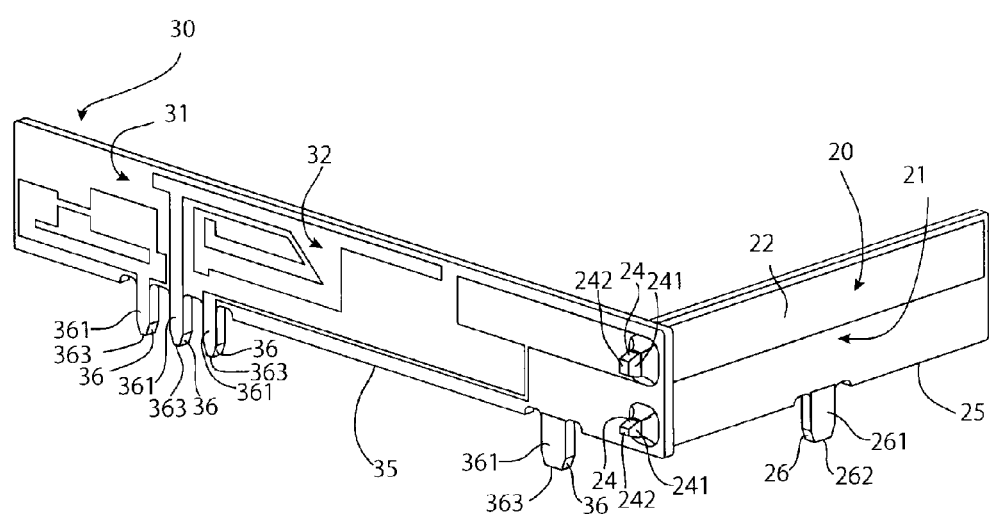
FIG. 3 is a perspective view of the first child board assembled with the second child board.

In assembling the first child board 20 and the second child board 30, as shown in FIG. 3, the two terminal areas 24 of the first child board 20 are inserted into the two through holes 34 of the second child board 30, respectively. In that state, the terminal areas 24 are soldered to the inner wall surfaces of the through holes 34. Since the terminal areas 24 are covered with the electrically conductive material films on all four sides thereof, the terminal areas 24 are soldered on all sides thereof. This makes it possible to achieve a narrow terminal.

In this relationship between the first child board 20 and the second child board 30, the first child board 20 is equivalent to an example of the circuit board having a terminal (first circuit board) of the present invention. Further, the second child board 30 is equivalent to an example of the second circuit board of the present invention. Moreover, a combination of these first and second child boards 20 and 30 is equivalent to an example of the circuit board assembly of the present invention.

As shown in FIGS. 2 and 3, the first child board 20 includes another terminal area 26 that projects downward from a lower end face 25 of the first child board 20. This terminal area 26, too, has a projecting shape that is flush with the front and back sides of the first child board 20 and that is as thick as the first child board 20. Moreover, this terminal area 26 has a first surface 261, covered with an electrically conductive material film, that is flush with the front surface 21 of the first child board 20 and a second surface, covered with an electrically conductive material film, that serves as a back surface of the terminal area 26. Further, both side surfaces of this terminal area 26 that intersect the first surface 261 and the second surface are covered with electrically conductive material films. That is, as is the case with the terminal areas 24, this terminal area 26, too, is covered with an electrically conductive material film all around on four sides, namely the first surface 261, the second surface, and both side surfaces. It should be noted that, as in the case of the terminal areas 24, a tip end face 262 of the terminal area 26 that projects from the first child board 20 may be covered with an electrically conductive material film, too. In this case, a solder fillet can be formed into a better shape. This tip end face 262 is equivalent to an example of the fifth surface of the present invention.

The second child board 30 has four terminal areas 36, shown in FIGS. 2 and 3, that project downward from a lower end face 35 of the second child board 30, and three of them are sequentially arranged in proximity to one another. Each of these terminal areas 36, too, has a projecting shape that is flush with the front and back sides of the second child board 30 and that is as thick as the second child board 30. Moreover, each of these terminal areas 36 has a first surface 361 and a second surface 362, covered with electrically conductive material films, that are flush with the front surface 31 and back surface 39 of the second child board 30, respectively. Furthermore, both side surfaces of each of the terminal areas 36 that intersect the first surface 361 and the second surface 362 are covered with electrically conductive material films, too. That is, as is the case with the terminal areas 24 and 26 of the first child board 20, each of these terminal areas 36, too, is covered with an electrically conductive material film all around on four sides, namely the first surface 361, the second surface 362, and both side surfaces. It should be noted that, as in the case of the terminal areas 24 and 26, a tip end face 363 of each of the terminal areas 36 that projects from the second child board 30 may be covered with an electrically conductive material film, too. The end face 363 is equivalent to an example of the fifth surface of the present invention.

Figure 4:
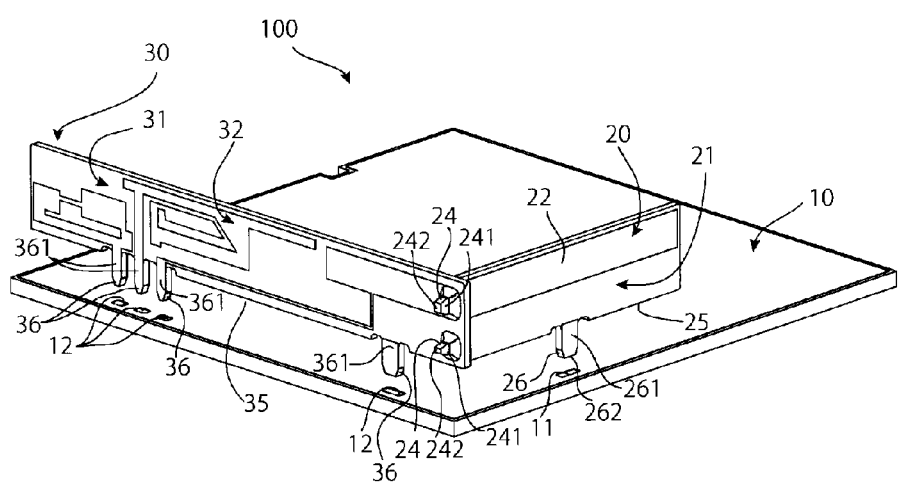
FIG. 4 is an exploded perspective view of a parent board and the first child board assembly with the second child board.

The downwardly-projecting terminal areas 26 and 36 of these first and second child boards 20 and 30 serve as terminal areas through which an L-shaped assembly of the first child board 20 and the second child board 30, shown in FIG. 3 is soldered, to the parent board 10, as shown in FIG. 4. The arrangement of the three terminal areas 36 of the four downwardly-projecting terminal areas 36 is connected to the antenna pattern 32. Moreover, each of those three terminal areas 36 serves as a terminal area of such dimensions as to match in impedance with the antenna pattern 32.

As shown in FIG. 4, the parent board 10 has a through hole 11 into which the downwardly-projecting terminal area 26 of the first child board 20 is inserted. Further, the parent board 10 has four through holes 12 into which the four downwardly-projecting terminal areas 36 of the second child board 30 are inserted. Those through holes 11 and 12 have their inner wall surfaces covered with electrically conductive material films on all sides thereof by non-electrolytic plating. Moreover, the terminal areas 26 and 36 are inserted into and soldered to the through holes 11 and 12, respectively. FIG. 1 shows a state where the first child board 20 and the second child board 30 are mounted on the parent board 10 in this manner.

In the relationship between the parent board 10 and the assembly of the first child board 20 and the second child board 30, the assembly of the first child board 20 and the second child board 30 is equivalent to an example of the circuit board having a terminal of the present invention, i.e. an example of the first circuit board of the present invention. Further, in this case, the parent board 10 is equivalent to an example of the second circuit board of the present invention. Moreover, a combination of the assembly of the first child board 20 and the second child board 30 and the parent board 10 is equivalent to an example of the circuit board assembly of the present invention.

The present invention provides a circuit board 20, 30 having a terminal 24, 26, 36, and a circuit board assembly 100 that make it possible to use an end of a circuit board 20, 30 as a terminal and also as a narrow terminal that is inserted into and soldered to a through hole 11, 12, 34.

It should be noted that although a description has been given here by taking, as an example, a circuit board having an antenna pattern, the present invention is also applicable to a circuit board having no antenna pattern. Further, although a description has been given here by taking, as an example, a combination of L-shaped child boards and a parent board, the present invention is not limited to this combination but may be widely adopted in assembling circuit boards together.

What is claimed is:

1. A circuit board, comprising:
a terminal area projecting from an end face of the circuit board, the terminal area is flush with a front side and a back side of the circuit board and has a thickness equal to the circuit board, the terminal area has a plurality of sides covered with an electrically conductive material, the sides including a first surface flush with the front side of the circuit board, a second surface flush with the back side of the circuit board, and a pair of side surfaces that intersect the first surface and the second surface; and
another terminal area projecting downward from a lower end face of the circuit board that is perpendicular to the end face of the circuit board, the another terminal area extends perpendicularly with respect to the terminal area.

2. The circuit board of claim 1, further comprising an antenna pattern on at least one of the front side and the back side.

3. The circuit board of claim 1, wherein the terminal area has a fifth surface at a projecting tip of the terminal area, the fifth surface is covered with the electrically conductive material.

4. The circuit board of claim 1, wherein the another terminal area is flush with the front side and the back side of the circuit board and has a thickness equal to the circuit board.

5. The circuit board of claim 4, wherein the another terminal area has a plurality of sides covered with the electrically conductive material.

6. The circuit board of claim 5, wherein the another terminal area has a tip end face covered with the electrically conductive material.

7. A circuit board assembly, comprising:
a first circuit board having a terminal area projecting from an end face of the first circuit board, the terminal area is flush with a front side and a back side of the first circuit board and has a thickness equal to the first circuit board, the terminal area has a plurality of sides covered with an electrically conductive material, the sides including a first surface flush with the front side of the first circuit board, a second surface flush with the back side of the first circuit board, and a pair of side surfaces that intersect the first surface and the second surface, the first circuit board has another terminal area projecting downward from a lower end face of the first circuit board that is perpendicular to the end face of the first circuit board, the another terminal area extends perpendicularly with respect to the terminal area; and
a second circuit board having a through hole with an inner wall surface covered with the electrically conducting material on all sides, the inner wall surface and the sides of the terminal area are soldered to each other with the terminal area inserted in the though hole.

8. The circuit board assembly of claim 7, further comprising a main board, the first circuit board and the second circuit board are connected to the main board.

9. The circuit board assembly of claim 8, wherein the another terminal area has a plurality of sides covered with the electrically conductive material.

10. The circuit board assembly of claim 9, wherein the main board has a through hole with an inner wall surface covered with the electrically conducting material on all sides.

11. The circuit board assembly of claim 10, wherein the another terminal area is inserted into the through hole of the main board and soldered to the inner wall surface of the through hole of the main board.

12. The circuit board assembly of claim 8, wherein the second circuit board has a plurality of downwardly-projecting terminal areas projecting downward from a lower end face of the second circuit board.

13. The circuit board assembly of claim 8, wherein the first circuit board and the second circuit board are both perpendicular to the main board, the first circuit board is perpendicular to the second circuit board.

* * * * *